United States Patent [19]

Gabara et al.

[11] Patent Number: 5,040,035
[45] Date of Patent: Aug. 13, 1991

[54] MOS DEVICES HAVING IMPROVED THRESHOLD MATCH

[75] Inventors: Thaddeus J. Gabara, North Whitehall Township, Lehigh County; Peter C. Metz, Emmaus, both of Pa.

[73] Assignee: AT&T Bell Laboratories, Murray Hill, N.J.

[21] Appl. No.: 634,930

[22] Filed: Dec. 27, 1990

Related U.S. Application Data

[63] Continuation of Ser. No. 456,008, Dec. 22, 1989, abandoned.

[51] Int. Cl.$^5$ .................. H01L 27/01; H01L 29/00; H01L 29/78; H01L 29/10
[52] U.S. Cl. ............................. 357/23.4; 357/23.1; 357/22; 357/41; 437/29; 437/36; 437/41
[58] Field of Search ................ 357/41, 22 G, 23.4, 357/23.1; 437/29, 41, 36

[56] References Cited

U.S. PATENT DOCUMENTS

| 4,636,825 | 1/1987 | Baynes | 357/23.14 |
| 4,748,487 | 5/1988 | Uchida et al. | 357/43 |

FOREIGN PATENT DOCUMENTS

| 0248270 | 5/1987 | European Pat. Off. | 357/41 |
| 1906324 | 2/1968 | Fed. Rep. of Germany | 357/41 |
| 55-096672 | 7/1980 | Japan | 357/23.1 |
| 55-133572 | 10/1980 | Japan | 357/41 |
| 56-069865 | 6/1981 | Japan | 357/23.4 |
| 57-133677 | 8/1982 | Japan | 357/41 |
| 59-032175 | 2/1984 | Japan | 357/41 |
| 59-34666 | 2/1984 | Japan | 357/41 |
| 63-204655 | 8/1988 | Japan | 357/23.1 |

OTHER PUBLICATIONS

"Some Consequences of Ion Beam Shadowing in CMOS Source/Drain Formation", by R. W. Gregor, *IEEE Electron Device Letters*, vol. EDL-7, No. 12, Dec. 1986, pp. 677–679.

"HEXFET, A New Power Technology, Cuts On-Resistance, Boosts Ratings", *Electronic Design* 12, Jun. 7, 1979, pp. 36–40.

*Primary Examiner*—Andrew J. James
*Assistant Examiner*—Daniel Kim
*Attorney, Agent, or Firm*—James H. Fox

[57] ABSTRACT

In certain circuits, it is desirable to match the electrical characteristics, (e.g., thresholds), of two (or more) MOS transistors. For example, in an ECL output buffer, a first transistor is a voltage reference, and a second transistor is an output buffer controlled by this voltage reference. However, the orientation of the transistors may affect their electrical characteristics. This may be due to the source/drain ion implantation step that occurs at an angle off the vertical, or other processing effects. The present invention provides symmetrical MOS transistors having characteristics that are independent of orientation. For example, a square gate layout provides both vertical and horizontal current components, thereby obtaining 90 degree rotational symmetry.

23 Claims, 4 Drawing Sheets

MOS DEVICES HAVING IMPROVED THRESHOLD MATCH

This application is a continuation of application Ser. No. 07/456008, filed on Dec. 22, 1989, now abandoned.

BACKGROUND OF THE INVENTION

1. Field of the Invention

The present invention relates to a technique for improving the match of the electrical characteristics of MOS devices on an integrated circuit.

2. Description of the Prior Art

Figure 4:
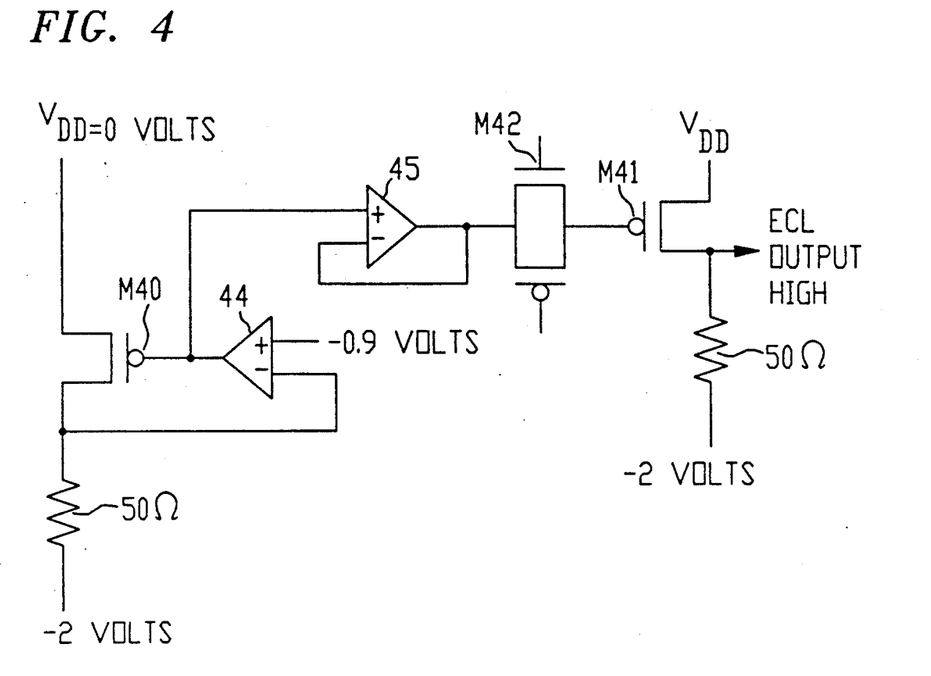
FIG. 4 shows an ECL output buffer that advantageously uses the inventive transistors.

In certain integrated circuit applications, it is desirable to have two or more transistors with well-matched electrical characteristics. For example, in CMOS output buffers that provide ECL output levels ($-0.9$ to $-1.7$ volts), it is desirable to obtain a precise and well-controlled output level, in order to properly match the characteristics of the ECL bipolar devices. One type of ECL output buffer is shown in FIG. 4, wherein a reference MOS device M40 is provided, and the transistor M41 is used to set the level of the ECL "high" output voltage. Note that the gates of M40 and M41 are coupled together, by means of operational amplifiers 44, 45, and pass gate transistors M42, M43. It is desirable that the electrical characteristics of M40 and M41 be well-matched. (A comparable circuit may be used for setting the ECL "low" output voltage.) This type of output buffer is more fully described in U.S. patent application Ser. No. 371,356, filed June 26, 1989, and co-assigned herewith.

Figure 5:
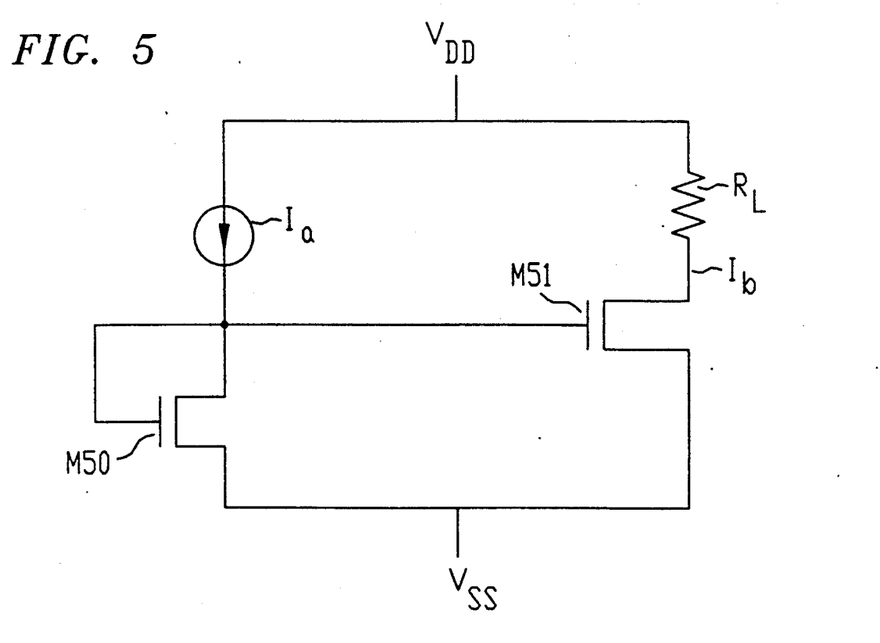
FIG. 5 shows a current mirror that advantageously uses the inventive transistors.

In another example, FIG. 5 illustrates a current mirror, wherein the gate and drain of a reference transistor M50 are connected together, with a current source causing a channel current Ia to flow. A "mirror" transistor M51 has its gate connected to the gate of the reference transistor, and the channel current Ib flowing though load $R_L$ will be equal, or proportional, to Ia, depending on the relative sizes of the transistors. To obtain precise control of Ib, the electrical characteristics (e.g., threshold and transconductance) of M51 should be the same as that of M50. More than one transistor can mirror the current in M50 in a similar manner. For an example of a current source having a current mirror, see U.S. Pat. No. 4,645,948 co-assigned herewith. However, the "reference" transistors of these examples (e.g., M40, M50) may be located on the integrated circuit at significant distances from the other transistors that should be matched to them (e.g., M41, M51). In these applications, the gate-to-source voltages of the matched transistors are identical, or nearly so.

It is recognized in the art that the location of a transistor on an integrated circuit can affect its characteristics. For example, the gate oxide thickness can vary over the surface of the integrated circuit. This can produce differences in the channel current that flows for a given gate-to-source voltage from one transistor as compared to another. For this reason, circuit and layout techniques have been developed to compensate for the differing transistor characteristics. For example, the "common centroid" configuration utilizes a group of four transistors arranged at the corners of a rectangle, with the diagonal pairs being connected in parallel. This effectively creates two transistor pairs, which may be used to implement a current mirror. The processing variations that are a function of placement (i.e., along the x and y axes of the broad surface of the chip) then largely cancel out. This is because each pair includes a transistor having the same x-axis location as one transistor of the other pair, and the same y-axis location as the other transistor of the other pair, thereby averaging out variations that are solely a linear function of position.

In addition, their are some process variations that result from orientation effects. For example, the ion beam implantation of source/drain regions may create shadowing effects that affect transistor performance, by changing the threshold voltage. This is discussed by R. W. Gregor in "Some Consequences of Ion Beam Shadowing in CMOS Source/Drain Formation", *IEEE Electron Device Letters*, Vol. EDL-7, No. 12, pp. 677-679 (1986). To negate such orientation-dependent effects, the prior art layout techniques required that matched transistors be oriented in the same direction, and with current flows in the same direction. However, such requirements limit design flexibility, and can complicate the layout process.

SUMMARY OF THE INVENTION

We have invented an integrated circuit including field effect transistors that are each designed to have nominally equal and opposite source/drain current components flowing in orthogonal directions. In a typical embodiment, the gate electrode of a MOS transistor forms a square, with other symmetrical configurations being possible. This technique facilitates the layout of matched transistors even when the transistors are spaced apart significant distances on the integrated circuit.

DETAILED DESCRIPTION

Figure 7:
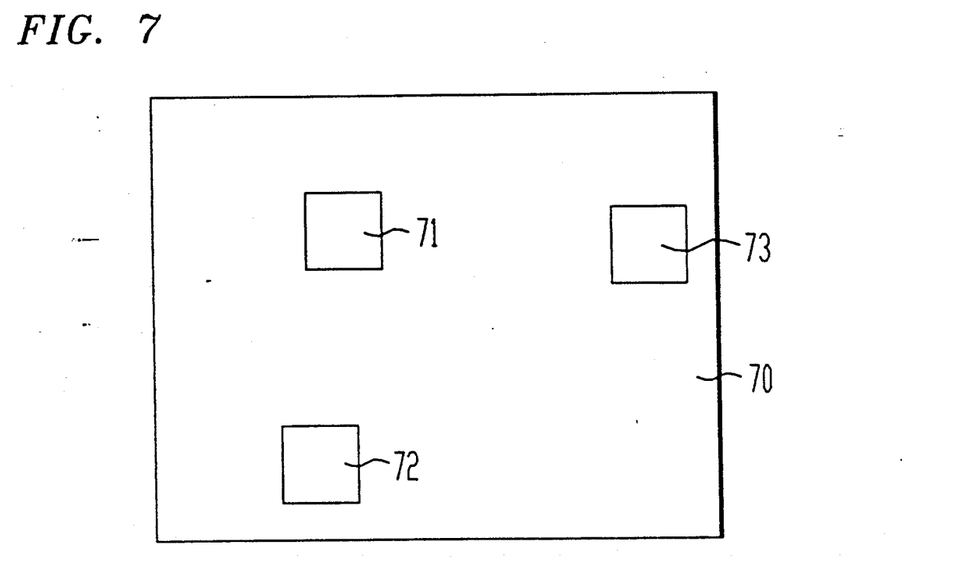
FIG. 7 shows a typical layout of matched transistors along the edges of an integrated circuit chip.

The present detailed description refers to an integrated circuit technique that allows for placement of matched transistors in any orientation while obtaining improved control of transistor characteristics. In the present technique, a MOS transistor is designed so that orientation effects cancel out. This provides for improved ease of circuit layout, especially when the transistors are spaced apart at significant distances on an integrated circuit. For example, referring to FIG. 7, the 90 degree rotational symmetry of the square-gate transistors described herein allows for placement of matched transistors (72, 73) in the I/O frame along different edges of an IC chip (70), as is typically the case for output buffers, without regards as to horizontal verses vertical transistor design. The reference transistor 71 to which the others are matched may be located either in the interior of the chip as shown, or along an edge. This simplifies the design of integrated circuits, since a single transistor geometry may be used in all locations, without the possibility of introducing errors with regard to orientation.

As used herein, "matched" implies that in operation, it is desired to obtain either the same source-to-drain voltage across the transistors, or channel currents that are proportional to the sizes of the transistors, depending on the application. The matched transistors may be of equal or unequal sizes, providing for either the same or different channel currents, respectively.

Figure 1:
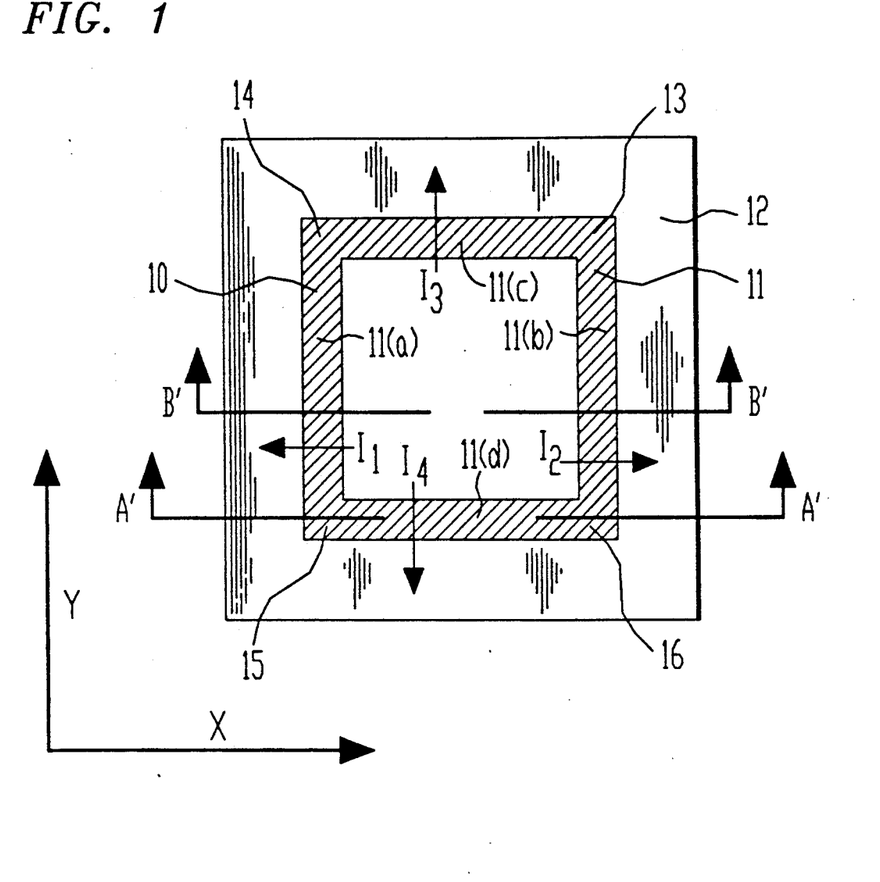
FIG. 1 shows a typical embodiment of the invention, wherein the gate electrode forms a square.

Referring to FIG. 1, an MOS transistor is shown in a top view, as formed in a semiconductor substrate. The transistor includes a doped source region 10, gate electrode 11 (overlying a gate dielectric), and doped drain region 12. In the illustrative embodiment, the source and drain regions are p+, with the gate overlying a n type region, so that a p-channel device is formed. The structure is arranged so that the channel current flowing between the source and drain regions comprises symmetrical horizontal and vertical components I1 ... I4. That is, the square gate structure provides a left-hand portion 11(a), right-hand portion 11(b), top portion 11(c), and bottom portion 11(d) as viewed. Portions 11(a) and 11(b) are parallel to the y-axis of the integrated circuit chip, whereas portions 11(c) and 11(d) are parallel to the x-axis, which is orthogonal to the y-axis. (The x-axis is typically the short axis of the chip, and the y-axis is typically the long axis.) The lengths of portion 11(a) ... 11(d) are essentially equal.

As a result of this layout, current I1 and current I2 are nominally equal in magnitude, and flow in opposite directions. Similarly, currents I3 and I4 are nominally equal and opposite. Therefore, the effect of process variations tend to be the same for all such square-gate transistors. For example, shadowing of the source/drain ion implant by the gate structure may occur if the ions are implanted at an angle off the vertical, as is frequently the case. Consider the case that the angle of implantation is slightly (e.g., 7 degrees) to the left of the vertical as viewed in FIG. 1. The gate shadowing will cause a slight variation in the values of I1 and I2 from the nominal design value, whereas I3 and I4 will be relatively unaffected. However, that variation in I1 and I2 will be substantially the same for all of the transistors on a given integrated circuit that are of the square-gate type shown in FIG. 1. Note that the square-gate transistors have 90 degree rotational symmetry.

Figure 8:
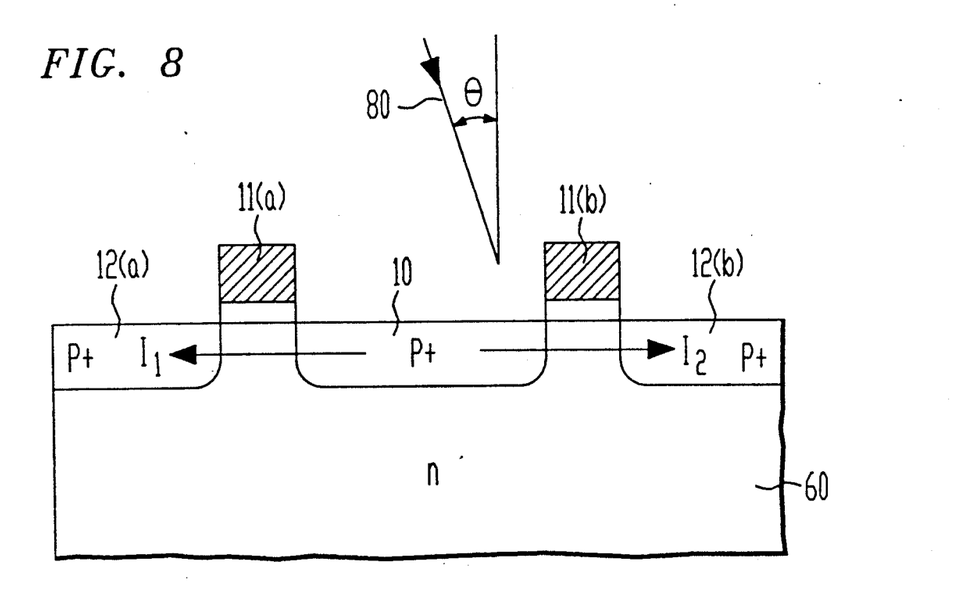
FIG. 8 shows a cross-section view along line B'—B' of the embodiment of FIG. 1.

The effect of ion beam shadowing may be seen more clearly in FIG. 8, which is a cross-section view taken along B'—B' of FIG. 1, and labelled correspondingly. The integrated circuit is formed in semiconductor body 60, and comprises source region 10, gate electrode 11, and drain region 12. In particular, drain regions 12(a) and 12(b), and gate electrodes 11(a) and 11(b) correspond to the left and right hand portions of these features as shown in FIG. 1, respectively. It can be seen that the dopant ions 80, implanted at an angle $\theta$ from the normal, will be shadowed by gate electrodes 11(a) and 11(b), as noted above. This may affect the currents I1 and I2, by causing a deviation from their nominal values, as discussed below.

The slight variations from nominal may have either the same, or opposite, signs, depending on the processing effects. For example, some processing effects may cause both I1 and I2 to increase slightly from the nominal. Alternately, other processing effects may cause I1 to increase slightly and I2 to decrease slightly from the nominal values. Furthermore, the magnitude of the variations may be different for I1 and I2. (Comparable statements may be made about I3 and I4). In any of these cases, the variations will tend to be the same for all the transistors of the inventive design on a given integrated circuit. Therefore, the circuit designer need not be concerned with respect to vertical or horizontal orientation of the square-gate transistors. That is in contrast to the case wherein the transistors have conventional gate structures, in which case the vertically-oriented transistors will be affected differently than the horizontally-oriented transistors.

Figure 6:
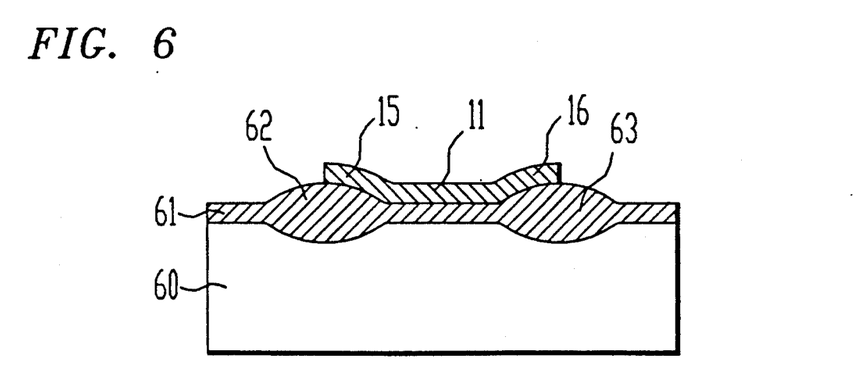
FIG. 6 shows a cross-section view along line A'—A' of the embodiment of FIG. 1.

For improved electrostatic discharge (ESD) protection, the gate conductor in the corner regions 13 ... 16 may be run over the field oxide region, rather than over the thin oxide layer that forms the gate dielectric. This is because a high electric field is produced by the sharp angles of the gate conductor at these points. This may be seen in the sectional view taken along A'—A' of the gate structure of FIG. 6, wherein the silicon substrate 60 has formed thereon a thin oxide layer 61 which serves as the gate dielectric. The relatively thicker field oxide regions (e.g., 62, 63) then serve to provide increased ESD breakdown protection at the corners (e.g., 15,16). However, the increased ESD protection is not necessary in all designs, or all process technologies.

It is possible to increase the current-carrying capacity of the inventive transistors by a concentric gate design. For example, referring to FIG. 2, an inner gate 201 controls the current flow from source 202 to drain regions 203, 204, 205 and 206 (i.e., currents I1, I2, I3 and I4). In addition, outer gate 207 controls the current flow from source 208 to drain regions 203 ... 206 (i.e., currents I5, I6, I7 and I8). The inner and outer gates are connected together, as by conductors 209 ... 212, which are typically formed of the same conductive layer as gates 201 and 207 (e.g., polysilicon or polycide). As above, it is desirable that the corner regions (e.g., 213, 214) be placed over the field oxide regions for ESD protection. The conductors 209 ... 212 are then also conveniently run over the field oxide regions. To contact the gate, source, and drain regions, contact windows may be formed in an overlying dielectric, and aluminum (or other conductors) patterned to provide the required connections, according to principles well known in the art. Still more current capacity may be obtained by the use of two or more transistors of the inventive type that are formed adjacent one another and interconnected.

Figure 3:
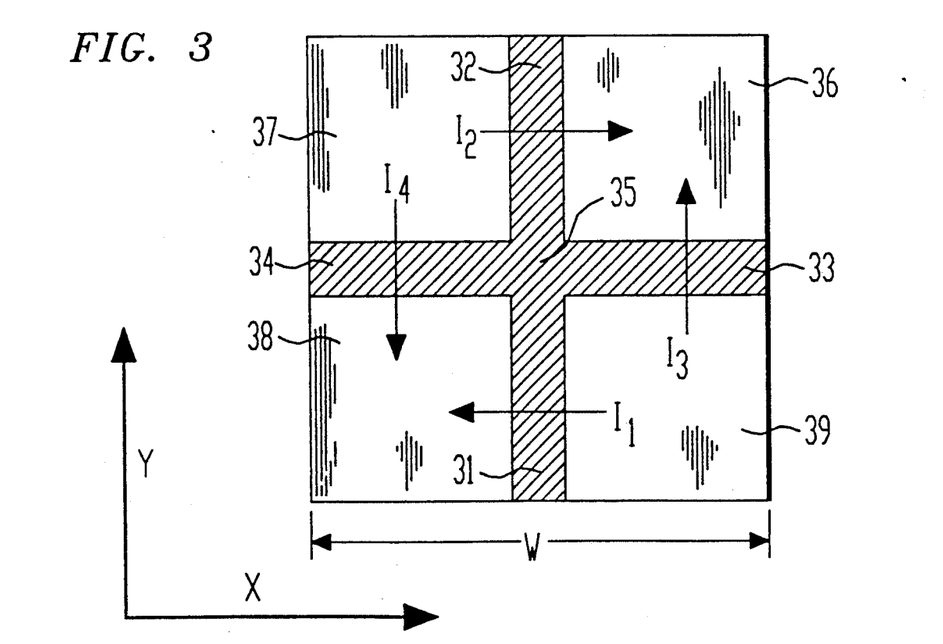
FIG. 3 shows an alternate embodiment of the invention, wherein the gate electrode forms a cross.

The foregoing has shown a square-gate transistor, which is a presently-preferred embodiment of the invention, being relatively compact and readily laid out on an integrated circuit. However, other embodiments of the inventive technique are possible. For example, FIG. 3 shows the gate in the form of a cross. The gate conductor comprises vertical portions 31, 32 and horizontal portions 33, 34. These gate portions control channel current components I1, I2, I3, and I4, respectively. Diagonally opposite doped regions 37 and 39 comprises the source, and doped regions 36 and 38 comprise the drain of the transistor. Note that as above, there are current components of nominally equal magnitude flowing in opposite directions along two orthogonal axes. As in the foregoing structures, it is desirable for the intersection region 35 of the gate electrode to be run over the relatively thick field oxide region, for improved ESD protection.

Still other gate geometries are possible, as with gates that encompass hexagonal or even higher-order polygons with an even number of sides. The sides of a given polygon are equal in length, thereby obtaining an equilateral, and hence symmetrical, structure. Note that to obtain matched transistors, the sides of the gate of one transistor are oriented parallel to the corresponding sides of the gate of the other transistor matched thereto. However, as with the squares, the sizes of the encompassed regions may be different, as to obtain current-scaled devices. In the limiting case, even gates that define circular-shaped source/drain regions are possible, and in fact may provide the best matched transistors. For example, the square gate 11 in FIG. 1 may be replaced by a circular gate. However, at present, the square-gate layout is preferable for ease of lithographic definition.

The above embodiments illustrate the current flows for p-channel transistors, with the flows for n-channel transistors being in the opposite directions. Also, the orientation of the gate portions parallel to the edges of a rectangular integrated circuit are typical for the layout of an integrated circuit chip, but not necessary, as long as the gate segments of the one matched transistor are parallel to those of the other matched transistor. The effect of ion implantation angle on the variation of the threshold voltage from the nominal value has been noted above. However, other orientation-dependent processing operations that cause a departure from nominal electrical characteristics can also be compensated by the inventive technique. Such operations could include, for example, etching or lithographic operations. Matched transistors of the inventive design are typically spaced apart at least 5 times the width of the gate "W", as defined in FIGS. 2 and 3, and more typically at least 10 times "W". With present-day integrated circuit geometries, this is a typical spacing of at least 100 micrometers, and in many cases even more than 1 millimeter.

We claim:

1. An integrated circuit comprising at least two matched field effect transistors each having doped source and drain regions formed in a semiconductor body, with said source and drain regions being separated by a channel region overlaid by a gate electrode, with said matched transistors being spaced apart on said integrated circuit, and having their gate electrodes coupled together, characterized in that the gate electrodes of said matched transistors comprise first and second orthogonal sections that are of equal length, and wherein at least two of said matched transistors are spaced at least 100 micrometers apart.

2. The integrated circuit of claim 1 wherein the gate electrode of at least one of said matched transistors defines a first square.

3. The integrated circuit of claim 2 wherein the gate electrode of at least one of said matched transistors further defines a second square concentric with said first square.

4. The integrated circuit of claim 2 wherein the gate electrode of at least one of said matched transistors is in the form of two orthogonal intersecting lines of equal length.

5. The integrated circuit of claim 1 wherein at least two of said matched transistors are spaced at least 1 millimeter apart.

6. The integrated circuit of claim 1 wherein at least two of said matched transistors are of equal size.

7. The integrated circuit of claim 1 wherein at least two of said matched transistors are of unequal size.

8. The integrated circuit of claim 1 wherein a first one of said matched transistors is located along a first edge of an integrated circuit chip, and a second one of said matched transistors is located along a second edge of said integrated circuit chip.

9. The integrated circuit of claim 1 wherein said first and second orthogonal sections are spaced from said semiconductor body by a dielectric having a given thickness, and wherein said first and second orthogonal sections converge at a corner section spaced from said semiconductor body by a dielectric having a thickness greater than said given thickness.

10. The integrated circuit of claim 1 further characterized in that the gate electrodes of said matched transistors are designed so that in operation the channel current flowing between the source and drain regions of each transistor are nominally equal in magnitude, and opposite in direction, along two orthogonal axes.

11. An integrated circuit comprising at least first and second matched field effect transistors each having: a source region and a drain region formed in a semiconductor body and separated by a channel region overlaid by a gate electrode, and with said first and second matched transistors having their gate electrodes coupled together;

characterized in that the gate electrodes of said first and second matched transistors each define an equilateral polygon, wherein the sides of the polygon defined by the gate of said first transistor are oriented parallel to the sides of the polygon defined by the gate of said second transistor, and wherein the polygons defined by the gates of said first and second transistors are of unequal size.

12. The integrated circuit of claim 11 wherein said first and second matched transistor are spaced at least 100 micrometers apart.

13. The integrated circuit of claim 11 wherein said first and second matched transistor are spaced at least 1 millimeter apart.

14. The integrated circuit of claim 11 wherein said first matched transistor is located along a first edge of an integrated circuit chip, and said second matched transistor is located along a second edge of said integrated circuit chip.

15. The integrated circuit of claim 11 further characterized in that the gate electrodes of said first and second matched transistors are designed so that in operation the channel current flowing between the source and drain regions of said transistors are nominally equal in magnitude, and opposite in direction, along two orthogonal axes.

16. An integrated circuit comprising at least first and second matched field effect transistors each having a source region and a drain region formed in a semiconductor body and separated by a channel region overlaid by a gate electrode, and with said first and second matched transistors having their gate electrodes coupled together;

characterized in that the gate electrodes of said first and second matched transistors each define an equilateral polygon, wherein the sides of the polygon defined by the gate of said first transistor are oriented parallel to the sides of the polygon defined by the gate of said second transistor, and wherein said first and second matched transistors are spaced at least 100 micrometers apart.

17. The integrated circuit of claim 16 wherein at least two of said matched transistor are spaced at least 1 millimeter apart.

18. The integrated circuit of claim 16 wherein a first one of said matched transistors is located along a first edge of an integrated circuit chip, and a second one of said matched transistors is located along a second edge of said integrated circuit chip.

19. The integrated circuit of claim 16 further characterized in that the gate electrodes of said matched transistors are designed so that in operation the channel current flowing between the source and drain regions of said matched transistors are nominally equal in magnitude, and opposite in direction, along two orthogonal axes.

20. An integrated circuit comprising at least two matched field effect transistors each having doped source and drain regions formed in a semiconductor body, with said source and drain regions being separated by a channel region overlaid by a gate electrode, with said matched transistors being spaced apart on said integrated circuit, and having their gate electrodes coupled together, characterized in that the gate electrodes of said matched transistors comprise first and second orthogonal sections that are of equal length, and wherein said first and second orthogonal sections that are of equal length, and wherein said first and second orthogonal sections are spaced from said semiconductor body by a dielectric having a given thickness, and wherein said first and second orthogonal sections converge at a corner section spaced from said semiconductor body by a dielectric having a thickness greater than said given thickness.

21. An integrated circuit comprising at least first and second matched field effect transistor each having doped source and drain regions formed in a semiconductor body, with said source and drain regions being separated by a channel region overlaid by a gate electrode, and with said first and second matched transistors having their gate electrodes coupled together, characterized in that the gate of each of said first and second matched transistors defines a circle, and wherein said first and second matched transistors are spaced at least 100 micrometers apart.

22. The integrated circuit of claim 21 wherein at said first and second matched transistor are spaced at least 1 millimeter apart.

23. The integrated circuit of claim 21 wherein said first matched transistor is located along a first edge of an integrated circuit chip, and said second matched transistor is located along a second edge of said integrated circuit chip.

* * * * *

UNITED STATES PATENT AND TRADEMARK OFFICE
CERTIFICATE OF CORRECTION

PATENT NO.   : 5,040,035

DATED        : 08/13/91

INVENTOR(S)  : T. J. Gabara, P. C. Metz

It is certified that error appears in the above-identified patent and that said Letters Patent is hereby corrected as shown below:

The title page should be deleted, and substitute therefor the attached title page.

In FIG. 1, the position of the lead line from reference number 10 is corrected as shown on the attach sheet.

Figure 2:
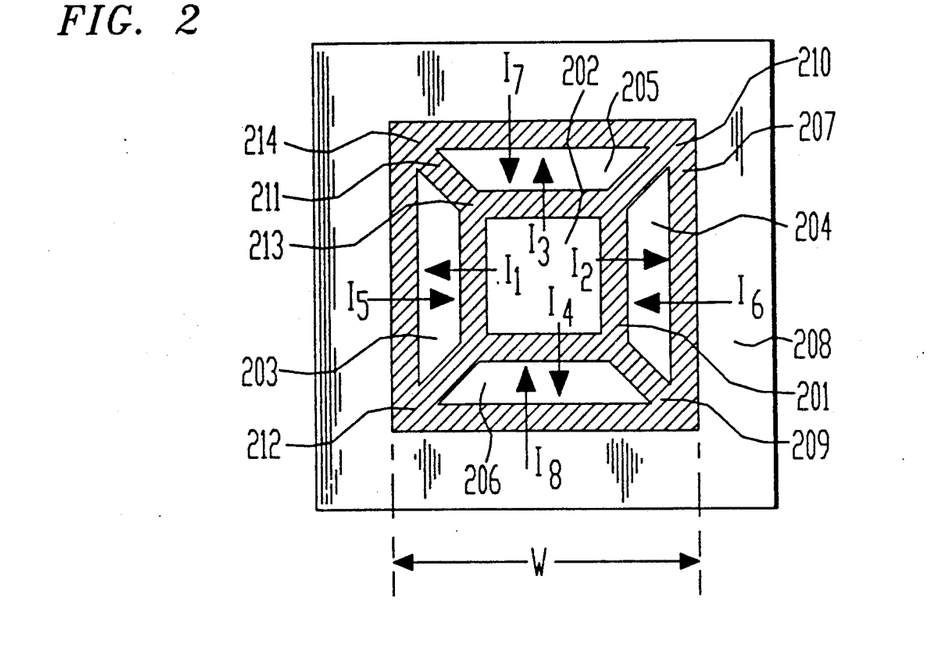
FIG. 2 shows in more detail an embodiment of the invention, wherein the gate electrode forms concentric squares.

In FIG. 2, the positions of the lead lines from reference numbers 209, 210, 211 and 212 are corrected as shown on the attached sheet.

Signed and Sealed this

Sixteenth Day of February, 1993

Attest:

STEPHEN G. KUNIN

Attesting Officer

Acting Commissioner of Patents and Trademarks

United States Patent [19]

Gabara et al.

[11] Patent Number: 5,040,035
[45] Date of Patent: Aug. 13, 1991

[54] MOS DEVICES HAVING IMPROVED THRESHOLD MATCH

[75] Inventors: Thaddeus J. Gabara, North Whitehall Township, Lehigh County; Peter C. Metz, Emmaus, both of Pa.

[73] Assignee: AT&T Bell Laboratories, Murray Hill, N.J.

[21] Appl. No.: 634,930

[22] Filed: Dec. 27, 1990

Related U.S. Application Data

[63] Continuation of Ser. No. 456,008, Dec. 22, 1989, abandoned.

[51] Int. Cl.⁵ .............. H01L 27/01; H01L 29/00; H01L 29/78; H01L 29/10
[52] U.S. Cl. .................. 357/23.4; 357/23.1; 357/22; 357/41; 437/29; 437/36; 437/41
[58] Field of Search .............. 357/41, 22 G, 23.4, 357/23.1; 437/29, 41, 36

[56] References Cited

U.S. PATENT DOCUMENTS

| | | | |
|---|---|---|---|
| 4,636,825 | 1/1987 | Baynes | 357/23.14 |
| 4,748,487 | 5/1988 | Uchida et al. | 357/43 |

FOREIGN PATENT DOCUMENTS

| | | | |
|---|---|---|---|
| 0248270 | 5/1987 | European Pat. Off. | 357/41 |
| 1906324 | 2/1968 | Fed. Rep. of Germany | 357/41 |
| 55-096672 | 7/1980 | Japan | 357/23.1 |
| 55-133572 | 10/1980 | Japan | 357/41 |
| 56-069865 | 6/1981 | Japan | 357/23.4 |
| 57-133677 | 8/1982 | Japan | 357/41 |
| 59-032175 | 2/1984 | Japan | 357/41 |
| 59-34666 | 2/1984 | Japan | 357/41 |
| 63-204655 | 8/1988 | Japan | 357/23.1 |

OTHER PUBLICATIONS

"Some Consequences of Ion Beam Shadowing in CMOS Source/Drain Formation", by R. W. Gregor, *IEEE Electron Device Letters*, vol. EDL-7, No. 12, Dec. 1986, pp. 677-679.

"HEXFET, A New Power Technology, Cuts On-Resistance, Boosts Ratings", *Electronic Design* 12, Jun. 7, 1979, pp. 36-40.

*Primary Examiner*—Andrew J. James
*Assistant Examiner*—Daniel Kim
*Attorney, Agent, or Firm*—James H. Fox

[57] ABSTRACT

In certain circuits, it is desirable to match the electrical characteristics, (e.g., thresholds), of two (or more) MOS transistors. For example, in an ECL output buffer, a first transistor is a voltage reference, and a second transistor is an output buffer controlled by this voltage reference. However, the orientation of the transistors may affect their electrical characteristics. This may be due to the source/drain ion implantation step that occurs at an angle off the vertical, or other processing effects. The present invention provides symmetrical MOS transistors having characteristics that are independent of orientation. For example, a square gate layout provides both vertical and horizontal current components, thereby obtaining 90 degree rotational symmetry.

23 Claims, 4 Drawing Sheets